(12) United States Patent
Lally et al.

(10) Patent No.: US 6,198,207 B1
(45) Date of Patent: Mar. 6, 2001

(54) HIGH-VOLUME PRODUCTION, LOW COST PIEZOELECTRIC TRANSDUCER USING LOW-SHRINK SOLDER OF BISMUTH OR ANTIMONY ALLOY

(75) Inventors: Richard Lally; Isaak Baber, both of Virginia Beach, VA (US)

(73) Assignee: Oceana Sensor Technologies, Virginia Beach, VA (US)

( * ) Notice: Subject to any disclaimer, the term of this patent is extended or adjusted under 35 U.S.C. 154(b) by 0 days.

(21) Appl. No.: 09/386,472

(22) Filed: Aug. 31, 1999

Related U.S. Application Data
(60) Provisional application No. 60/098,963, filed on Sep. 1, 1998.

(51) Int. Cl.[7] .................................................. H01L 41/053

(52) U.S. Cl. ............................................ 310/348; 310/340

(58) Field of Search ........................... 310/333, 338, 310/340, 348, 349, 321, 328, 323.4, 323, 324

(56) References Cited

U.S. PATENT DOCUMENTS

| | | | | |
|---|---|---|---|---|
| 5,020,035 | * | 5/1991 | Kompanek | 367/159 |
| 5,123,282 | * | 6/1992 | Ikeda et al. | 73/704 |
| 5,146,526 | * | 9/1992 | Sweeney et al. | 385/90 |
| 5,898,992 | * | 5/1999 | Annable | 29/840 |
| 5,982,708 | * | 11/1999 | Pearce | 367/157 |

* cited by examiner

Primary Examiner—Thomas M. Dougherty
(74) Attorney, Agent, or Firm—Miles & Stockbridge P.C.; John C. Kerins

(57) ABSTRACT

A method of manufacture and a piezoelectric transducer are provided having a housing whose interior contains a piezoelectric element having radially spaced surfaces which undergo relative shear and produce an electrical signal in response thereto, an outer radial surface of the piezoelectric element being soldered to the interior of the housing, and an inner radial surface of the piezoelectric element is soldered to the outer surface of a stress/strain transmitting element. The solder alloy used shrinks less than 2.5% at solidification. The subassembly made up of the piezoelectric element and the stress/strain transmitting element is provided with a passage to permit escape of gas from a chamber above the piezoelectric member which may be present from vapors attendant soldering.

13 Claims, 7 Drawing Sheets

HIGH-VOLUME PRODUCTION, LOW COST PIEZOELECTRIC TRANSDUCER USING LOW-SHRINK SOLDER OF BISMUTH OR ANTIMONY ALLOY

CROSS REFERENCE TO RELATED APPLICATIONS

Applicants hereby claim the benefit of their provisional application Ser. No. 60/098,963 filed Sep. 1, 1998, for a High Volume Production Low Cost Piezoelectric Accelerometer in the name of Richard W. Lally and Isaak Baber.

BACKGROUND OF THE INVENTION

1. Field of the Invention

This invention relates to piezoelectric transducers and particularly to those operating by shear mode deformation of piezoelectric element.

2. Description of Related Art

Piezoelectric transducers have a wide application. They can work as sensors, in which they generally convert a mechanical energy (displacement, acceleration, force, pressure, stress and stress) into an electrical signal (direct effect). Piezoelectric transducers can also be used as actuators or resonators, in which they convert an electrical energy into mechanical (reverse effect).

Piezoelectric transducers are well known for their exceptional bandwidth and dynamic range. Symmetry, rigidity, amplification, lightweight, and shear mode are often identified as design attributes which deliver high performance. Simple construction with few parts and capability of mass production are often identified as desirable characteristics for low cost devices. Notwithstanding that much effort has been put forth to achieve these attributes and characteristics in piezoelectric transducers, efforts have been thwarted because many of the attributes are mutually exclusive. For example, stress amplification often results in a reduction in rigidity and the resultant frequency bandwidth. Additionally, simple stress amplifying designs known as bimorphs and bender beams have precluded the use of shear mode piezoelectric elements which provide high performance with critical temperature insensitivity. It has remained a constant goal of the industry to produce a simple design that delivers high quality and a robust transducer performance.

Broad utilization of piezoelectric-based transducers in the past has been hampered by the associated cost of manufacture. Traditional designs are both labor and component intensive. In the case of piezoelectric accelerometers, for example, piezoelectric beam design accelerometers have disproportionately low strength and a low frequency band. Miniature surface-mounted piezoelectric accelerometers exhibit low resolution.

Automation has brought about the introduction of the silicon micromachined (MEMS) accelerometer. The manufacturing of these devices is automated and they can be produced at low cost, but MEMS accelerometers employ beam type elements having limited resolution, low dynamic response and low frequency range.

Piezoelectric accelerometers of an annular shear type design are an example of a piezoelectric sensor recognized as being suitable for high volume, low cost production because of their simplicity, symmetry and because they require relatively few parts. However, known annular shear type designs suffer from drawbacks which prevent high performance and even higher volume production necessary for achieving a lower production cost, and more widespread use. There are two principal drawbacks associated with these devices. The first is the substantial machining required and the resulting high cost of component manufacturing in order to achieve an interference fit. The second is the use of ordinary solders or adhesives which have been proposed in order to address the first drawback.

Some accelerometer designs, such as those disclosed in U.S. Pat. Nos. 4,075,525 issued to Birchall, and 4,941,243 issued to Cleveland, require expensive conical parts with costly surface finishes. An annular shear accelerometer of the type disclosed in published patent application WO 91/06012, despite its simple design, does not recognize or address the challenges associated with developing a commercially viable low cost assembly of the element using solder. Technology for piezoelectric shear accelerometers has evolved to using more than one crystal in order to achieve interference fit designs. The necessity for more than one crystal increases the price of the sensor.

In general, the joining of annular parts of annular shear accelerometers is subject to several difficulties. One known method for joining together an accelerometer base, ceramic tube, and seismic mass includes joining the parts together by a tight fit and maintaining all other parts together by friction. Such a method requires the use of very close dimensional tolerances which hampers or precludes high volume production. One particular problem associated with such structure is the difficulty of securing mechanical contact of all curved surfaces at all annular locations of the interfitting parts. Conical or tapered parts require costly surface finishes to provide high linearity (<1 %) and resonant frequency (>20 kHz).

Known prior piezoelectric sensor constructions sometimes employ a conductive epoxy compound to fill in gaps and adhere parts together. In the case of the annular shear accelerometer it is common to fill in annular gaps between interfitting portions of the annular seismic mass, the ceramic piezoelectric tube, and the annular, housing with epoxy. Conductive epoxy compounds, however, exhibit low strength, stiffness and further, after hardening, they often contain many voids. It is hence difficult in such devices to control the quality of bonding and the resulting linearity and bandwidth of the sensor. Further, there are Theological problems such as material deformation and flow during and after manufacturing which cause unacceptable changes in sensor performance.

To overcome problems associated with epoxy bonding, many attempts have been made at solder bonding, without a good understanding of the potential sensor performance problems that may and do result from the use of solder bonding. Problems are often encountered due to solder shrinking after its solidification. Standard Sn—Pb solder alloy, after solidification, exhibits about 3–4% shrinkage. As a result, solder gaps may form upon solder solidification, which introduce a random distribution of high intensity residual mechanical stress. Under residual stress, very important properties of piezoelectric ceramics, such as the piezoelectric constant and relative dielectric constant, can change. This is very apparent in symmetrical shear sensor designs since the random residual stresses act in both axial and transverse directions. For example, a lead zirconate titanate piezoelectric ceramic tube may be used in an annular shear accelerometer construction. Before soldering, the crystal has a capacitance of 300 pF. After joining of the accelerometer parts using a solder alloy (63%Sn-37%Pb), the crystal may have a capacitance value anywhere from 120 pf to 300 pf, and the value obtained in the final product is not susceptible of prediction such that the change in value can be accounted for in the design of the accelerometer.

To solve these problems, attempts have been made to select piezoelectric materials that exhibit much greater independence of characteristics from stress, such as barium titanate, quartz and gallium orthophosphate. However, these materials have the distinct disadvantage of having very low piezoelectric charge constants compared to the traditional material formulations of lead zirconate titanate.

The use of solder joining technology has often led to low electrical insulation resistance of piezoelectric sensing elements at temperatures above 90° C., which introduces another problem. To this end, for optimal operation, the piezo-ceramic element of a sensor should have an insulation resistance more than $10^{10}$ ohms. Insulation resistance between electrodes less than $10^8$ ohms can result in an increase in bias voltage and/or noise of signal conditioning electronics and, consequently, the sensor cannot operate as desired. The source of low resistance discovered in connection with the present invention is the flux used in soldering. During soldering, a small amount of flux vapor may become trapped within a sensor. In the temperature range of about 100 to 125° C., this flux vapor decreases the electrode insulation resistance between electrodes of the ceramics from greater than $10^{10}$ ohms to less than $10^8$ ohms. This problem may arise with any type of flux, even a so-called "no clean" flux.

Finally, it is often cited in the prior art that solder joining is abandoned, avoided, or improved upon because of the limitation on operating temperature that the solder joining imposes on the operating range of a piezoelectric sensor. While it is technically true that many piezoelectric materials have potential operating temperature ranges exceeding common soldering compounds, it is also true that the vast majority of piezoelectric sensors incorporate signal conditioning circuitry in the sensor. Signal conditioning circuitry generally sets the upper temperature limit of the sensor to 121 degrees Celsius.

SUMMARY OF THE INVENTION

The present invention overcomes the drawbacks of prior piezoelectric sensor constructions and modes of manufacture, and enables high volume production at low cost.

The piezoelectric transducer, preferably embodied in the form of a sensor such as an accelerometer, according to the present invention, is defined by a cylindrical housing or cap comprising a thin wall, nonmagnetic metal cylinder with an integral lower, radially outwardly extending, flange within which are coaxially mounted a seismic mass and a surrounding piezo-ceramic element. The flange is secured to a base or header which closes off or seals the interior of the housing to the atmosphere. A signal conditioning amplifier may be mounted on the interior of the header (base) prior to it being hermetically welded to the lower flange of the housing after the housing has been evacuated and filled with an inert gas such as nitrogen.

The inner lateral surface of the housing is conducive to solder adhesion, while, similarly, the radially outer lateral side surface of the seismic mass is conducive to solder adhesion. Likewise, the inner and outer lateral surfaces, i.e., the radially inner and outer lateral surfaces of the piezo-ceramic are conducive to solder adhesion. The noted lateral surfaces of the seismic mass, the piezo-ceramic tube, and the housing are adhered by a solder alloy which contains at least 14% by weight of bismuth.

Further, according to one embodiment of the present invention, the cylindrical seismic mass has a channel in the form of a lengthwise groove or hole to place the interior housing spaces above and below the seismic mass in communication with each other. This allows free flow of inert gas to both sides of the seismic mass and piezo-ceramic tube, thereby avoiding the possibility of trapping flux vapor, $O_2$ and moisture which could result in early corrosion of the internal elements and reduced insulation resistance, which is detrimental to proper operation of the accelerometer.

The piezo-ceramic tube is electrically connected to a signal conditioner input or directly to a sensor output pin. If an integral signal conditioner is included, its output is electrically connected to header pins carried by the base to enable the output to be read or recorded by standard instruments.

DETAILED DESCRIPTION OF THE INVENTION

Figure 1:
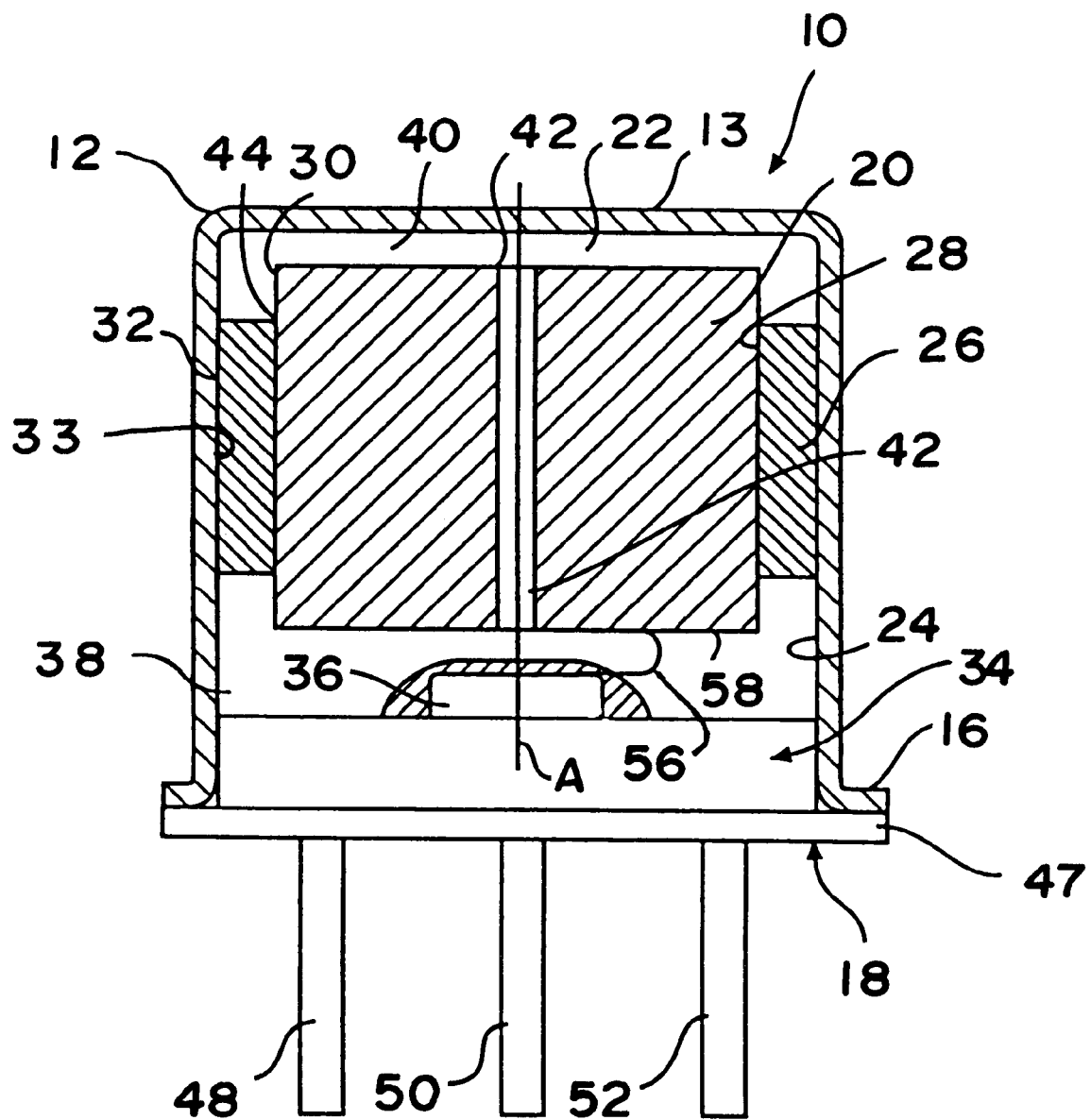
FIG. 1 is a transverse, elevational, partially cross sectional, view of a piezoelectric sensor in the form of an accelerometer according to the present invention having a central passage or channel in the seismic mass allowing free flow of gases to both ends.

Referring now to the drawings, FIG. 1 shows an annular, shear piezoelectric transducer in the form of an accelerometer according to one embodiment of the invention, denoted generally at 10. The main accelerometer components are assembled inside of the nonmagnetic cup shaped metal housing 12 flanged at its open end by outwardly turned section or integral flange 16. The integral flange 16 at the open end of housing 12 allows for convenient mounting of a closure member 18 and associated header 34. For convenience, the flanged open end of housing 12 is called the lower or bottom end and the other end of housing is called the top. Housing 12 thus forms a cap which is mounted on closure member 18. A stress/strain transmitting element in the form of a cylindrical tungsten seismic mass 20 is located in the central interior portion 22 of the housing 12 and is suspended from the internal wall 24 of the housing by a piezoelectric tubular element 26 having its internal surface 28 soldered to the outer surface 30 of the seismic mass 20, with the outer surface 32 of the piezoelectric component 26 soldered to the internal wall 24 of the housing 12.

The piezoelectric component 26 of the accelerometer is a piezoelectric shear mode material tube positioned between housing 12 and seismic mass 20 and the piezoelectric component 26 and seismic mass 20 are further positioned to allow for mounting of closure member 18 and its associated header 34, which supports an electronics package 36. Mass 20 and piezoelectric element 26 divide the interior 22 of the housing 12 into first and second chambers 38 and 40, respectively, which are in communication with each other via channel 42. Channel 42 preferably is centrally located on the central axis A longitudinal of seismic mass 20 and extends lengthwise completely through the seismic mass.

For better quality of soldering, the lateral surfaces of the piezoelectric material tube 26, seismic mass 20 and housing 12 to be joined are plated with tin, nickel or a solder alloy. The spaces or gaps between piezoelectric material tube 26, seismic mass 20 and housing 12 are preferably filled by a solder alloy which exhibits limited shrinkage after solidification and which preferably contains at least approximately 14% by weight of bismuth. Bismuth and, to a lesser extent, antimony, are exceptional among metals in having negative coefficients of volume contraction on solidification. That is, these metals exhibit a volume expansion rather than a volume contraction upon solidification. Table I identifies the known volume contraction on solidification for various elements that may be used in a solder alloy. The volume contraction is listed as a percentage of the volume prior to solidification, and the negative numbers presented for antimony and bismuth indicate negative contraction, namely, expansion.

TABLE I

| Element | Volume contraction on solidification, % |
|---|---|
| Zinc | 6.9 |
| Aluminum | 6.6 |
| Gold | 5.2 |
| Silver | 5.0 |
| Copper | 4.8 |
| Cadmium | 4.7 |
| Lead | 3.6 |
| Tin | 2.6 |
| Indium | 2.5 |
| Antimony | −0.9 |
| Bismuth | −3.3 |

By combining bismuth with other elements in a solder alloy, it is possible to reduce the negative volume change of the solder, along with attendant residual stress, on solidification (cooling from a temperature at which it is a liquid to a temperature at which it is a solid) of the solder. Preferred solder alloys for the joining of the accelerometer components are solder alloys comprising 43Pb-43Sn-14Bi (43% Pb, 43% Sn, and 14% Bi, by weight), or the lead-free solder alloy 60Sn-40Bi (60% Sn, 40% Bi). The shrinkage of the 43Pb-43Sn-14Bi solder alloy is less than about 2.3%. The shrinkage of the 60Sn-40Bi solder alloy is less than about 0.3%. Use of low shrinkage solder alloys minimizes resultant residual mechanical stress upon solidification. Thus, the piezoelectric constants, capacitance and other properties of the piezoelectric material tube remain substantially the same after soldering. By way of comparison, a standard 60Sn40Pb solder alloy exhibits about a 3% volume contraction on solidification.

As noted previously, in the manufacture of the accelerometer of FIG. 1, the radially outer surface 32 of piezoelectric material tube 26 is soldered to the interior cylindrical wall 24 of housing 12, and the outer surface 30 of seismic mass 20 is soldered to the inner radial surface 28 of the piezoelectric material tube 26. To this end, the mass 20, tube 26 and housing 12 are held in position by a suitable fixture while soldering. The inner surface 28 and outer surface 32 of tube 26, the outer surface of mass 20 and the inner surface 24 of housing 12 are preferably pretinned or plated with tin, nickel or a solder alloy at the surfaces where the tube 26, mass 20 and housing 12 are to be joined, to enhance soldering. The surfaces are thereafter treated to remove any oxides formed and/or to prevent further oxide formation. Solder is introduced at the junction 44 of the tube 26 and the mass 20, and at the junction 33 of tube 26 and housing 12. The tube 26 is placed over the mass 20 and the housing 12 placed over the tube, while supported by a suitable fixture. The fixture is then heated by conventional heating means to a temperature above the melting temperature of the solder, to allow the solder to melt and flow between the mating surfaces, after which the unit is cooled.

It is preferred that the melting temperature of the solder be less than the Curie temperature of the piezoelectric material tube 26, and possibly more than 100° C. less. Excessive shrinkage of the solder after solidification can create undesirable residual mechanical stresses in the tube and cause the piezoelectric constant, capacitance and other properties to change after soldering. Accordingly, the aforenoted solder alloy compositions are preferred for use. It can thus be seen that the choice of solder alloy is an important consideration in fabrication of a piezoelectric sensor, such as an accelerometer.

A vertical channel 42 is provided in mass 20 as a through hole or a groove, which establishes gas communication between the first and second chambers 38 and 40.

An electronics package, preferably in the form of a signal conditioning amplifier 36, is mounted on header 34, which is in turn coupled to closure member 18. An outer radial portion of closure member 18 may be regarded as a mating flange 47, which is preferably secured to flange 16 of the housing 12, thereby closing off the housing 12, and providing a hermetically sealed unit. It should be noted that, in the absence of channel 42, the accelerometer would be divided into two chambers, either of which could entrap undesirable flux vapors, moisture and/or air. Channel 42 provides communication between the spaced chambers 38 and 40 to provide a path to allow flux vapors and moisture to escape from the otherwise closed second chamber 40 during soldering. Channel 42 also provides access to the second chamber 40 to clean flux residue after soldering if necessary.

The output, power and ground of amplifier 36 are connected to pins 48, 50 and 52 which extend downwardly from the header 34, and by which the accelerometer 10 may be conveniently mounted in a socket of a printed circuit board (not shown). Fly wire 56 is attached to mass 20, upon closure of housing 12, when placed over the header 34 and after solder has been introduced to the junction of the fly wire and the end surface 58 of mass 20. The assembly is heated in a prescribed manner at a temperature sufficient to cause the solder to melt and thereby affix the fly wire to the mass 20. The melting temperature of the second solder alloy used in affixing the fly wire to the mass is preferably at least 25° C. less than the melting temperature of the first soldering alloy. After cooling, the sensor 10 is evacuated and filled with an inert gas, such as nitrogen. Housing 12 and closure 18 are joined together at flange 16 and mating flange 47 by welding.

Figure 2:
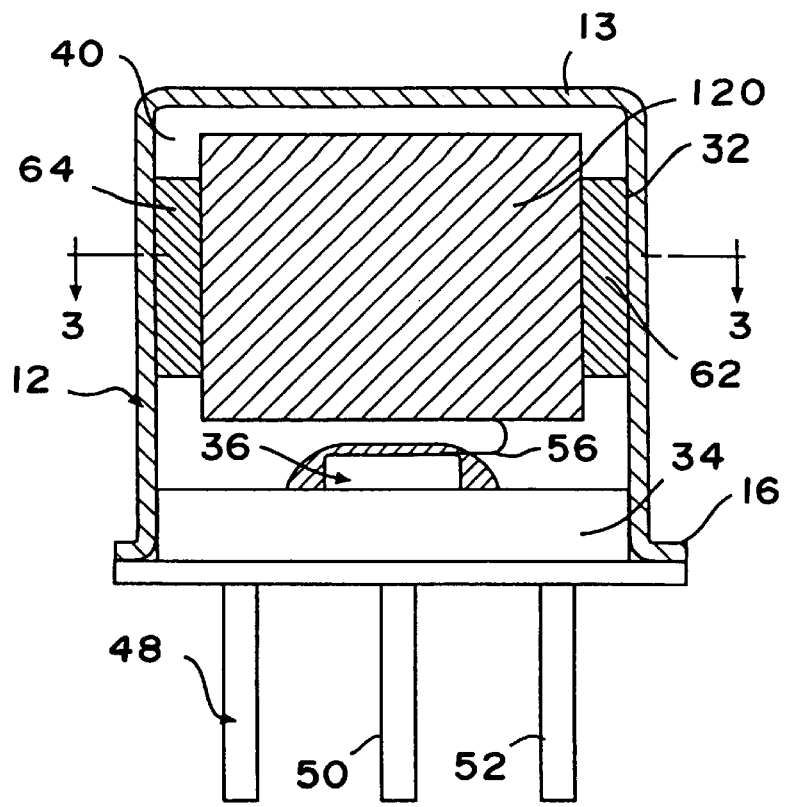
FIG. 2 is a view similar to FIG. 1 and shows another embodiment of the invention wherein channels are provided through the piezo-ceramic tube which is segmented.
Figure 3:
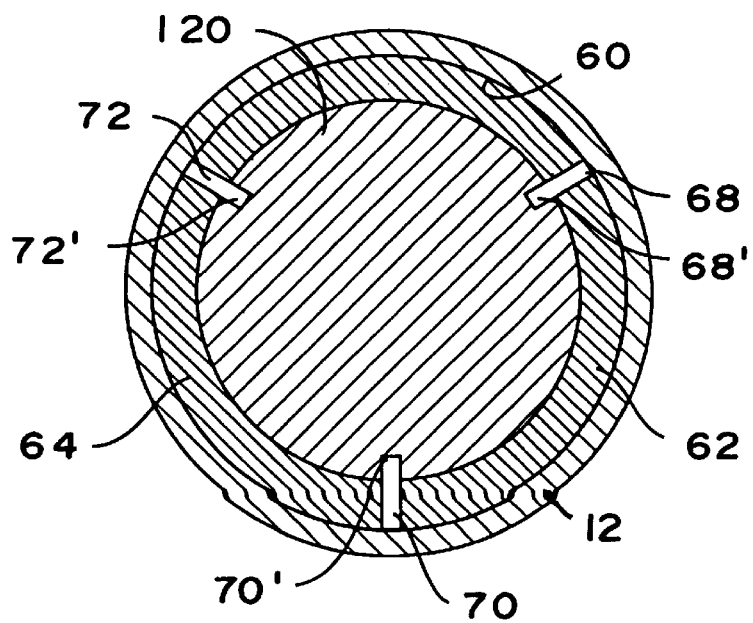
FIG. 3 is a view t ken along section 3—3 of FIG. 2.
Figure 4:
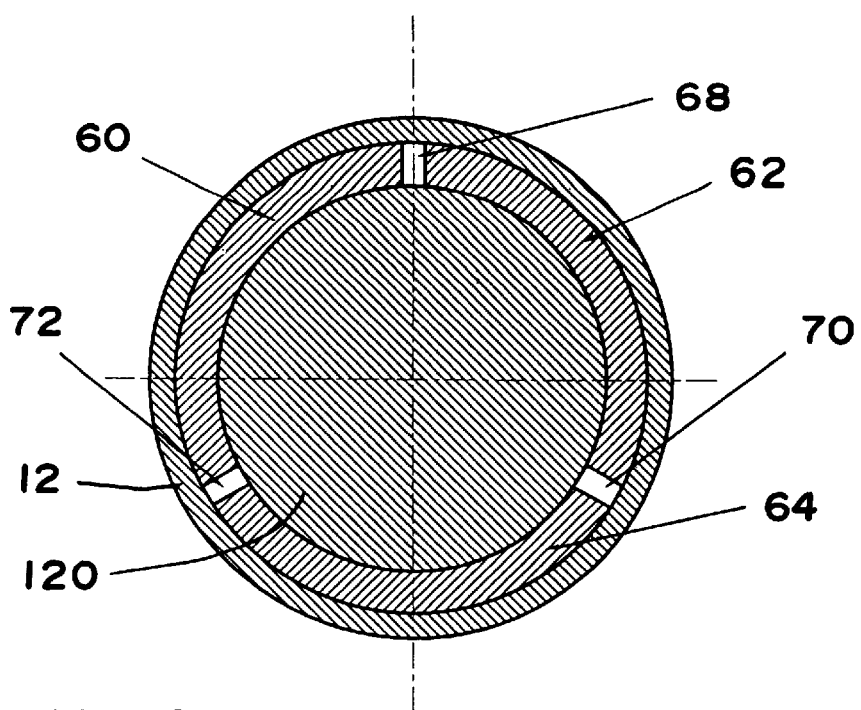
FIGS. 4 and 5 are sectional views similar to that of FIG. 3, showing two further preferred embodiments of channel or groove positions.
Figure 5:
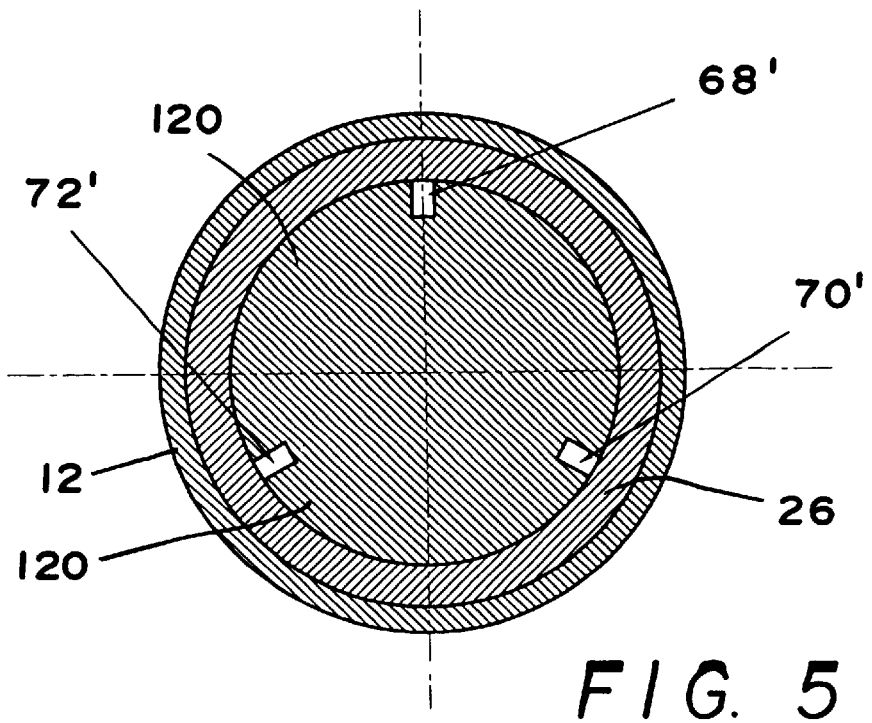

FIGS. 2 and 3 illustrate an accelerometer according to a second embodiment of the invention in which the annular shear piezoelectric material tube is divided into three substantially equal annular segments 60, 62 and 64 by first grooves or channels 68, 70 and 72 extending the length of ceramic tube 26, preferably at 120° intervals. Corresponding cooperating second grooves 68', 70' and 72' may be cut in mass 120 and may extend along substantially the entire length thereof. The first longitudinally extending grooves and, where present, the second longitudinally extending grooves which are in substantial alignment with the first grooves, decrease the base strain sensitivity. The grooves further provide access to the otherwise closed space 40 between the seismic mass 120 and top portion 13 of housing 12. In an alternative preferred configuration, the second grooves may be omitted, leaving only channels 68, 70, 72, to allow communication between the spaced chambers. This embodiment is illustrated in FIG. 4. A further preferred embodiment is to provide only the second grooves 68', 70', 72' in mass 120, but of a larger dimension than that shown, while leaving the annular tube 26 intact. This embodiment is illustrated in FIG. 5.

Figure 6:
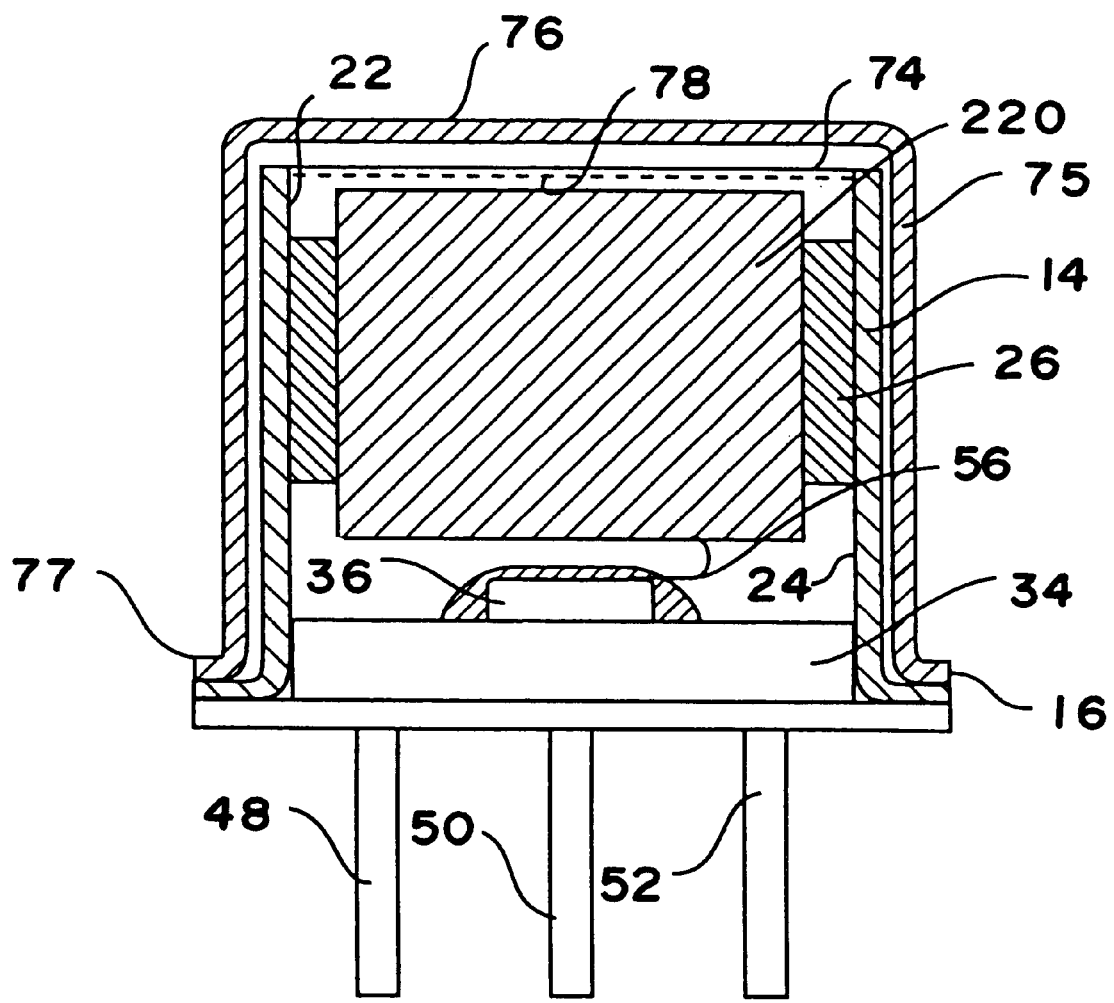
FIG. 6 is a view similar to FIG. 1, and shows another embodiment of the present invention employing a double cap.

FIG. 6 illustrates an accelerometer according to a further preferred embodiment of the invention wherein an inner cylindrical housing 14 has an open top 74, and is surrounded by a second outer cylindrical housing 75, the latter having a closed top portion 76 and also having a lower flange 77. In this particular embodiment, seismic mass 220 is open or accessible from both sides of the assembly (prior to affixing the header 34) and it is not necessary to have one or more channels in the mass for gas evacuation. This design is particularly advantageous for applications where the accelerometer is to be installed inside of an additional housing 75 or for sensor construction in which the open top of housing 12 is to be closed off by a welded cap represented in FIG. 6 by broken line 78.

Figure 7:
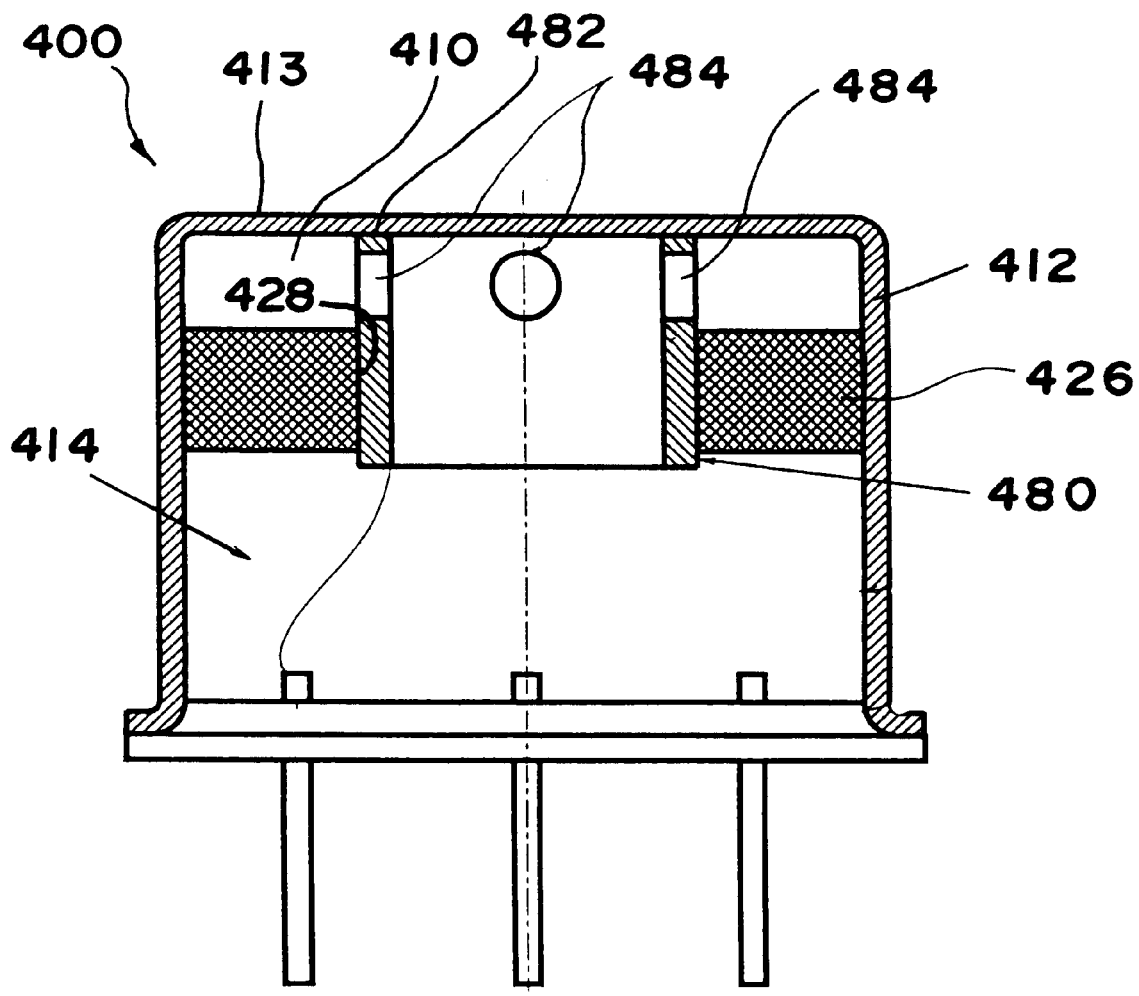
FIG. 7 is a view similar to that of FIG. 1, illustrating an alternative embodiment of the sensor of the present application for use as a pressure/force sensor.

FIG. 7 illustrates a partial cutaway view of an alternative preferred embodiment of a sensor of a type that can be advantageously used as a pressure or force sensor. In this embodiment, pressure/force sensor 400 includes a sensor subassembly which includes a piezoelectric material tube 426, an inner radial surface 428 of which is operatively coupled, preferably by a solder connection, to a mass tube 480. For use as a pressure/force sensor, to decrease an acceleration sensitivity, it is not necessary that a solid mass element be used, as is desired in the accelerometer configuration. The upper annular surface 482 of mass tube 480 is in contact with, and is preferably affixed to, the cap or top part 413 of housing 412. Pressure or force experienced on the cap 413 exerts force on mass tube 480, producing stress and/or strain in the piezoelectric material tube 426, thus causing a signal to be generated which is indicative of the force or pressure exerted on the cap 413.

This configuration provides gas or fluid communication between a first chamber 410, which would otherwise be isolated, and a second chamber 414, by providing holes or openings 484 in mass tube 480.

In each of the alternative preferred embodiments of FIGS. 2–7 discussed above, the seismic mass, the piezoelectric material element, and the housing immediately proximate to the piezoelectric element, are preferably joined by soldering, using a method substantially in conformance with that described with respect to the FIG. 1 embodiment. The characteristics of the preferred solder alloy will also be the same, and the 43Pb-43Sn-14Bi and 60Sn-40Bi solder alloys are again the preferred compositions. Other manufacturing and fabrication details are essentially the same, as well, unless otherwise noted.

Figure 8:
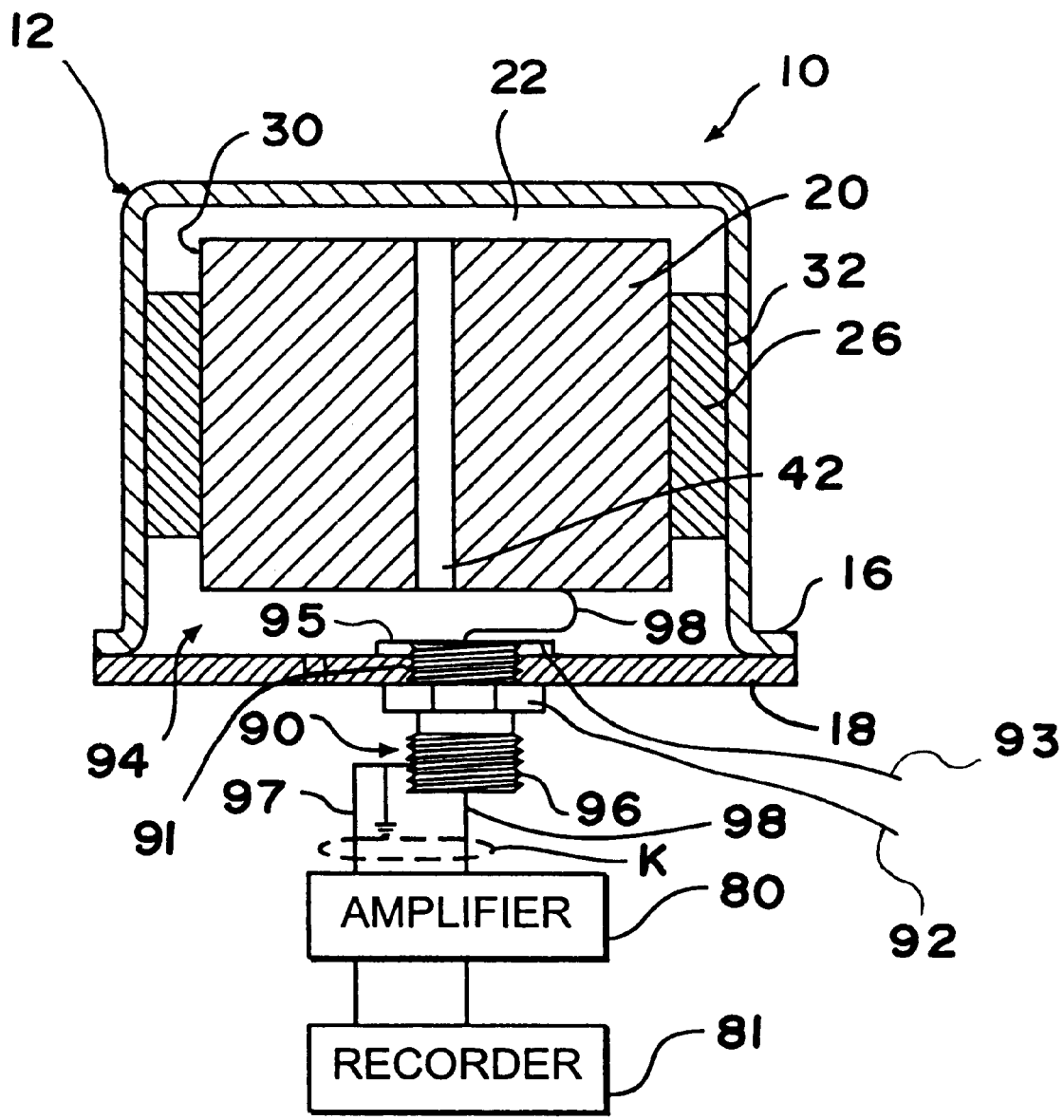
FIG. 8 is a view similar to FIG. 1 and shows another embodiment of the invention wherein the electronics are disposed externally of the housing.

Accelerometer 10 may have its electronic components disposed externally of the closed housing 12 as shown in FIG. 8. FIG. 8 shows housing 12 being closed off by a cap or plate member 18, which has a coaxial cable connector 90 threaded therein at 91 and fastened to the plate 18 by nut 92. Connector 90 may also have its internal end 93 extending sufficiently into the interior 94 of the accelerometer 10 to enable it to be fastened to the back of plate 18 by a back nut 95. Suitable seals may be provided to avoid leakage of the internal inert gas. Threaded end 96 of the coaxial connector 90 is connected to a conventional coaxial cable 97 (diagrammatically indicated at K). Cable 97 has its internal lead 98 electrically connected at one end to the mass member. The external shield of coaxial cable 97 and the other end of internal lead 98 are cooperatively connected to the input of amplifier 80 which is in turn connected to a suitable indicator or recorder device 81. Cable 97 has its shield grounded as shown. The essential fabrication steps, including the use of the non-shrinking solder, will be largely the same as those disclosed with respect to FIG. 1 above.

Figure 9:
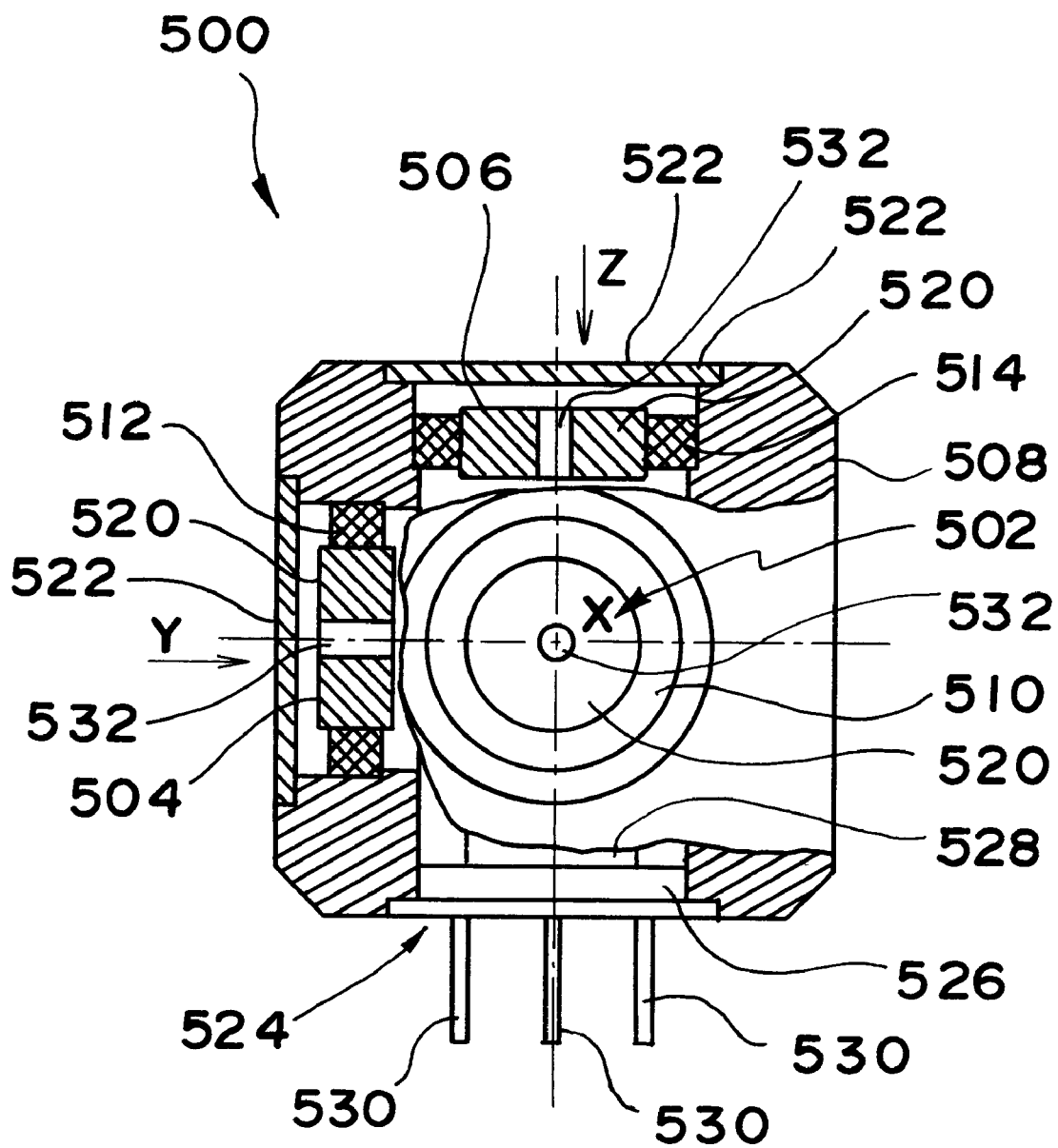
FIG. 9 is an elevational partially cutaway view of a further alterntive embodiment of the sensor of the present invention.

FIG. 9 illustrates a further embodiment of a piezoelectric transducer-based sensor 500 of a type that would be suitable for use as a tri-axial accelerometer or sensor, in which acceleration in specific directions can be sensed.

This alternative preferred embodiment includes three separate sensor subassemblies 502, 504, 506 positioned within a cube-shaped housing 508 such that they will operate to sense acceleration (or other force or pressure) along orthogonal x, y, and z axes. Each sensor subassembly 502, 504, 506 has a mass 520 which is preferably soldered, using a solder composition as described above, to an inner radial surface of a piezoelectric element 510, 512, 514. Each sensor subassembly 502, 504, 506 is closed by cover 522.

One opening 524, at a base of the housing, is closed off with a header 526 having a three-channel signal conditioning amplifier 528 mounted at an internal surface and pins 530 extending from an external surface.

This sensor is preferably fabricated in the same manner as are the foregoing embodiments, and openings 532 are provided in each of the masses 520, to enable fluid communication between all of the chambers in the interior of the housing.

While the invention has been described in conjunction with several specific embodiments, it is evident that many alternatives, modifications and variations can be realized in the broad realm of piezoelectric sensor designs for measuring variables as force, pressure, stress and strain. Such variations and modifications will be apparent to, or suggest themselves to, those skilled in the art. As but one example, it will become apparent from reading the foregoing disclosure that it would be possible to construct a sensor of this type in which the piezoelectric element has a plate shape. Accordingly, the preferred embodiments of the invention as set forth herein are intended to be illustrative, not limiting. Various changes may be made without departing from the true spirit and full scope of the invention as defined in the appended claims.

What is claimed:

1. A piezoelectric transducer comprising a housing and a transducer subassembly,
    said transducer subassembly being secured to an inner wall of said housing in a manner defining at least a first chamber and a second chamber within said housing on opposing sides of said transducer subassembly;
    said transducer subassembly further comprising a piezoelectric element operatively coupled to a stress/strain-transmitting element;
    wherein said piezoelectric element and said stress/strain transmitting element are affixed in position within said housing by a low-shrink solder whose volume changes less than about 2.5% in cooling from a liquid state to a solid state, said transducer assembly having a passage through said subassembly permitting fluid communication between said first and said second chambers.

2. A piezoelectric transducer as recited in claim 1, wherein said piezoelectric element and said stress/strain transmitting element are affixed in position within said housing by a low-shrink solder whose volume changes less than about 2.3% in cooling from a liquid state to a solid state.

3. A piezoelectric transducer as recited in claim 1, wherein said transducer subassembly is a sensor subassembly and said sensor subassembly is so constructed and arranged that said piezoelectric element generates a signal in response to a force detected by said stress/strain transmitting element.

4. A piezoelectric transducer as recited in claim 3, wherein said housing is a cylindrical housing having a closed end and defining a central axis of said transducer,
wherein said stress/strain transmitting element is disposed in a central portion of said housing and is substantially surrounded by said piezoelectric element, an outer surface of said transmitting element being affixed to an inner surface of said piezoelectric element, and said piezoelectric element being affixed to an inner wall of said housing.

5. A piezoelectric transducer as recited in claim 4 wherein said passage extending through said sensor subassembly comprises a passage extending through said stress/strain transmitting element.

6. A piezoelectric transducer as recited in claim 4 wherein said piezoelectric element is longitudinally separated into at least two segments, and wherein said passage is defined by a channel extending in a region where said at least two segments are separated.

7. A piezoelectric transducer as recited in claim 1, wherein said low shrink solder is a solder alloy comprising a metal selected from the group consisting of bismuth, antimony, and a combination of bismuth and antimony.

8. A piezoelectric transducer as recited in claim 1, wherein said solder is a solder alloy having a composition consisting essentially of about 43% by weight lead, about 43% by weight tin, and about 14% by weight bismuth.

9. A piezoelectric transducer as recited in claim 1, wherein said solder is a solder alloy having a composition consisting essentially of about 60% by weight tin and about 40% by weight bismuth.

10. A piezoelectric transducer as recited in claim 3, wherein said piezoelectric element is connected to a signal conditioning circuit so constructed and arranged to develop a signal in response to a detected force.

11. A piezoelectric transducer as recited in claim 10, wherein said signal conditioning circuit comprises a charge amplifier disposed within said housing for developing a signal in response to a detected force.

12. A piezoelectric transducer as recited in claim 10, wherein said signal conditioning circuit is disposed externally of said housing, and wherein said transducer further comprises a connector operatively coupled to the piezoelectric element in said housing and extending to an exterior of said housing where said connector is operatively coupled to said signal conditioning circuit.

13. A piezoelectric transducer comprising a housing and a transducer subassembly,
said transducer subassembly being secured to an inner wall of said housing;
said transducer subassembly further comprising a piezoelectric element and a shear stress/strain-transmitting element operatively coupled thereto so as to operate in shear mode;
wherein said piezoelectric element and said stress/strain transmitting element are affixed in position within said housing by a low-shrink solder whose volume changes less than about 2.5% in cooling from a liquid state to a solid state, said transducer assembly having a passage through said subassembly.

* * * * *